United States Patent [19]

Lewyn

[11] Patent Number: 4,665,380
[45] Date of Patent: May 12, 1987

[54] APPARATUS FOR CONVERTING BETWEEN DIGITAL AND ANALOG VALUES

[75] Inventor: Lanny L. Lewyn, Laguna Beach, Calif.

[73] Assignee: Brooktree Corporation, San Diego, Calif.

[21] Appl. No.: 755,170

[22] Filed: Jul. 15, 1985

[51] Int. Cl.⁴ .............................................. H03K 13/02
[52] U.S. Cl. ........................... 340/347 DA; 340/347 M
[58] Field of Search ..................... 340/347 DA, 347 M

[56] References Cited

U.S. PATENT DOCUMENTS

| | | | |
|---|---|---|---|
| 4,366,439 | 12/1982 | Yamakido | 340/347 DA |
| 4,369,433 | 1/1983 | Yamakido | 340/347 DA |
| 4,384,277 | 5/1983 | Allgood et al. | 340/347 DA |
| 4,491,825 | 1/1985 | Tuthill | 340/347 DA |

FOREIGN PATENT DOCUMENTS 0095674 12/1983 European Pat. Off. .

Primary Examiner—William M. Shoop, Jr.
Assistant Examiner—Sharon D. Logan
Attorney, Agent, or Firm—Ellsworth R. Roston; Charles H. Schwartz

[57] ABSTRACT

A first matrix relationship is defined by a plurality of switches operative in first and second states in accordance with the logic levels of binary signals introduced to the switches. The switches in the matrix relationship receive binary signals of relatively high binary significance. An activating line is connected to the matrix relationship to activate storage members, such as capacitors, connected to the matrix relationship. The number of storage members energized by the activating line at each instant is related to the value coded by the logic levels of the binary signals introduced to the matrix relationship. For increasing binary values, the storage members previously energized in the plurality by the activating line continue to be energized and additional storage members in the plurality are energized. An interpolating line is also provided in the first matrix relationship. The interpolating line receives a voltage related to the binary value coded by the logic levels of the binary signals of relatively low binary significance. This voltage may be produced by a second matrix relationship of conventional construction. This voltage is introduced through the interpolating line to a particular one of the storage members in the plurality, this storage member constituting the next to be connected to the activating line for increasing binary values. An output signal is produced corresponding to the cumulative value of the energy stored in the storage members in the plurality and in the particular storage member. The output signal may be produced by an integrator amplifier connected to the storage members in the plurality.

42 Claims, 4 Drawing Figures

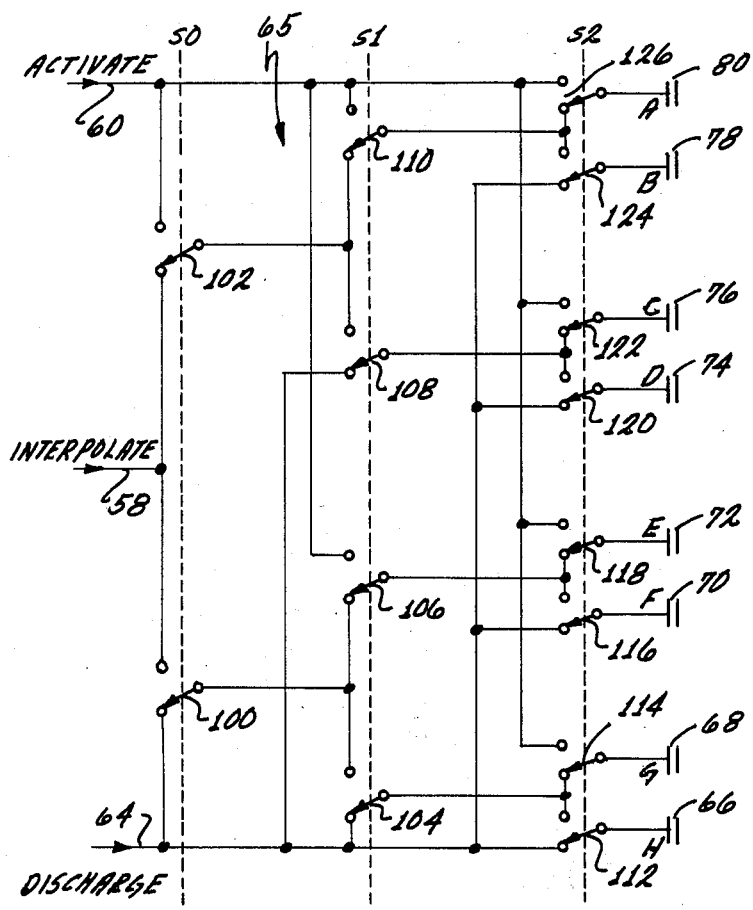
Fig. 2
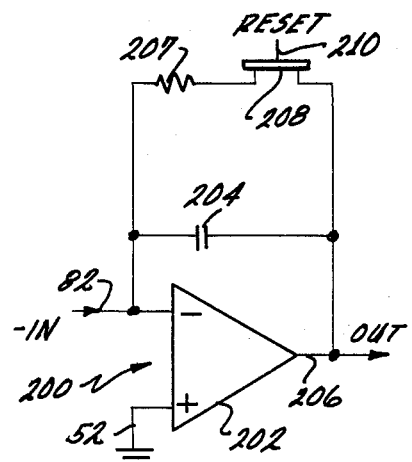
Fig. 3
Fig. 4
| "1" | "2" | "4" | CAPACITOR IN FIG. 2 | | | | | | | INTERPOLATION LINE 58 |
|---|---|---|---|---|---|---|---|---|---|---|
| 0 | 0 | 0 | A | E | C | G | B | F | D | A |
| 1 | 0 | 0 | A | E | C | G | B | F | D | E |
| 0 | 1 | 0 | A | E | C | G | B | F | D | C |
| 1 | 1 | 0 | A | E | C | G | B | F | D | G |
| 0 | 0 | 1 | A | E | C | G | B | F | D | B |
| 1 | 0 | 1 | A | E | C | G | B | F | D | F |
| 0 | 1 | 1 | A | E | C | G | B | F | D | D |
| 1 | 1 | 1 | A | E | C | G | B | F | D | H |

APPARATUS FOR CONVERTING BETWEEN DIGITAL AND ANALOG VALUES

BACKGROUND OF THE INVENTION

1. Field of the Invention

This invention relates to apparatus for converting data between a digital form and an analog form. More particularly, the invention relates to apparatus which provides such conversion instantaneously and on a monotonic basis and with minimal differential and integral errors.

Various types of equipment receive information in analog form. Such equipment includes process control equipment, measuring instruments, communications equipment and a wide variety of other equipments. Digital computers and data processing systems often receive input parameters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

A good example of the conversions discussed in the previous paragraph is in the recording and reproduction of music. The music is produced in analog form. It is converted to digital form by recently developed data processing techniques and is recorded on a medium such as a tape or a disc. When the music is to be reproduced, it is converted again to analog form because this is the form which is necessary to operate sound transducers to give meaning to the listener when he hears the music.

As digital computers and data processing equipment have become widespread throughout industry and the office and have even become common in the home, the need for inexpensive, simple and reliable apparatus for converting information between digital and analog forms has become of increasing concern. A considerable effort has been devoted over a period of several decades to provide for converting apparatus which is simple, inexpensive and reliable. In spite of such efforts, the converting apparatus now in use does not meet such criteria.

The converting apparatus now in use also has other problems of long standing. For example, the converting apparatus now in use may not be monotonic unless it is quite expensive and complex. By "monotonic" is meant that digital information of progressively increasing value is converted to analog information of progressively increasing value without any decrease in the analog value as the digital value progressively increases.

The converting apparatus now in use also has relatively high differential and integral nonlinearities unless the apparatus is quite expensive and complex. Integral nonlinearities result from errors produced in a conversion between digital and analog values over a wide range of such values Differential nonlinearities result in errors produced in a conversion between digital and analog values over a relatively narrow range of such values.

The converting apparatus now in general use also has a problem of major proportions. This results when the converter is operating near the mid-point of its full scale range, or near mid-scale, and digital values are increased incrementally by a single digit. For example, mid-scale problems result in the 12 bit converters now in use when a binary representation of 2047 is converted to a binary representation of 2048. This results from the fact that the binary representation of 2047 is represented by 011111111111 and a binary representation of 2048 is represented by 100000000000 where the least significant digit is at the right. Thus, at mid-scale, the value of every one of the binary digits changes. As all the binary values change, different weighting elements within the converter are selected and discontinuities may occur. These discontinuities may prevent the converter from being truly monotonic. This problem even exists in converters which are made quite complex in an attempt to overcome the problem.

In copending application Ser. No. 383,544 filed by Henry S. Katzenstein on June 1, 1982, for "Apparatus for Converting Data Between Analog and Digital Values" and assigned of record to the assignee of record of this application, apparatus is disclosed and claimed for converting between digital and analog values on a monotonic basis. The converter disclosed and claimed in application Ser. No. 383,544 has certain important advantages. For example, the converter provides an instantaneous conversion between digital and analog values on a monotonic basis for any digital value. The converter provides this conversion with relatively low differential and integral nonlinearities. The converter is quite simple in construction and is reliable in operation.

In copending application Ser. No. 553,041 filed by Henry S. Katzenstein on Nov. 18, 1983, for "Apparatus for Converting Data Between Digital and Analog Values" and assigned of record to the assignee of record in this application, a converter is also disclosed and claimed for converting between digital and analog values. The converter of application Ser. No. 553,041 constitutes an improvement of the converter of application Ser. No. 383,544, at least for converting information at relatively low frequencies. The converter of application Ser. No. 553,041 is similar to the converter of application Ser. No. 383,544 except that it employs energy storage members such as electrical capacitors to provide a conversion between the digital and analog values. The converter of application Ser. No. 553,041 is also advantageous in that the number of binary bits capable of being converted on an integrated circuit chip is enhanced and the energy storage members can be easily formed on the chip. The use of such energy storage members is also advantageous because they can be formed with minimal differences between them and because they are relatively stable with changes in temperature.

This invention also relates to apparatus for converting between digital and analog values. This invention can be considered to provide a converter distinct from, and advantageous over, those disclosed and claimed in applications Ser. Nos. 383,544 and 553,041. However, in one embodiment of the apparatus constituting this invention, such apparatus can employ a converter similar to those disclosed in applications Ser. Nos. 383,544 and 553,041, and particularly the converter disclosed and claimed in application Ser. No. 553,041. With such a converter, the apparatus of this invention also employs other stages for facilitating the conversion between the digital and analog values. The apparatus of this invention provides a conversion between the digital and analog values with even greater monoticity, and with even less integral and differential nonlinearities, than the converters of applications Ser. Nos. 383,544 and 553,041.

In one embodiment of the invention, a first matrix relationship is defined by a plurality of switches which are operative in first and second states in accordance with the pattern of binary signals introduced to the switches. An activating line is connected to the matrix relationship to activate energy storage members, such as capacitors, connected to the matrix relationship. The number of energy storage members energized by the activating line at each instant to store energy is related to the value coded by the logic levels of the binary signals introduced to the matrix relationship. For increasing digital values, the storage members previously energized in the plurality by the activating line continue to be energized and additional storage members in the plurality are energized as the digital values increase.

An interpolating line is provided in the first matrix relationship in addition to the activating line. The interpolating line receives a voltage related to the binary value coded by the logic levels of the binary signals of relatively low binary significance. This voltage may be produced by a second matrix relationship of conventional construction. This voltage is introduced through the interpolating line to a particular one of the storage members in the plurality. The particular storage member is the one to be connected next to the activating line for increasing digital values.

An output signal is produced corresponding to the cumulative value of the energy stored in the storage members in the plurality by the activating line and the energy stored in the particular storage member by the interpolating line. The output signal may be produced by an integrating amplifier connected to the storage members in the plurality.

In the drawings,

FIG. 2 is a circuit diagram which shows in additional detail certain of the features shown in block form in FIG. 1;

FIG. 3 is a circuit diagram which shows in additional detail an output stage shown in block form in FIG. 1; and FIG. 4 is a truth table illustrating the operation of the circuitry shown in FIG. 2.

Figure 1:
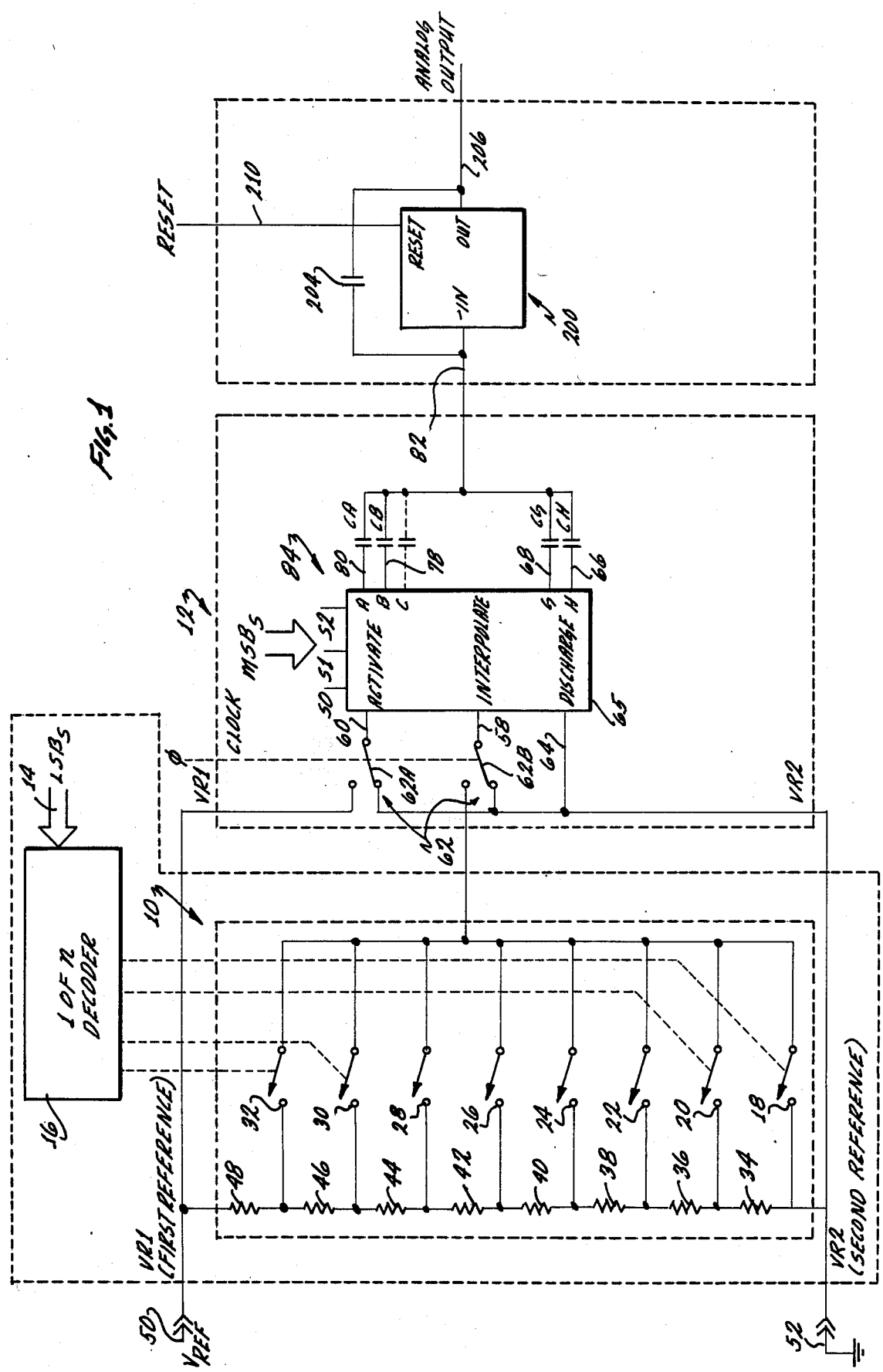
FIG. 1 is a circuit diagram, partially in block form of one embodiment of this invention for converting between digital and analog values.

FIG. 1 illustrates one embodiment of the invention. This embodiment includes two different converters respectively indicated on a general basis at 10 and 12. Each of the converters 10 and 12 may include a plurality of switches connected in a matrix relationship. The converter 10 may be constructed in a number of different embodiments, all conventional. The converter 10 may also be constructed in various embodiments such as disclosed and claimed in applications Ser. Nos. 383,544 and 553,041. The converter 12 is preferably, although not necessarily, constructed in a manner similar to the embodiments disclosed and claimed in application Ser. No. 553,041.

Each of the converters 10 and 12 converts into analog form digital values preferably coded by the logic levels of binary signals. These binary signals may have first and second logic levels respectively representing a binary "1" and a binary "0". The converter 10 converts the logic levels of binary signals of relatively low binary significance into analog form and the converter 12 converts the logic levels of binary signals of relatively high binary significance into analog form. The converter 10 is shown in FIG. 1 as converting three binary bits into analog form, as represented by the magnitude of an output voltage from the converter. These binary bits are the three (3) binary bits of least binary significance. However, as will be appreciated, the converter 10 may convert any desired number of binary bits into analog form. Similarly, the converter 12 is shown in FIG. 2 as converting three binary bits into analog form, as represented by the magnitude of an output current from the converter. These are the three (3) binary bits of highest binary significance. It will be appreciated, however, that the converter 12 may convert any desired number of binary bits into analog form.

The signals coded to represent the three least significant bits of a digital value coded in binary form are introduced in FIG. 1 through lines 14 into a decoder 16 which may be constructed in a conventional manner. The decoder 16 is operatively coupled to a plurality of normally open switches 18, 20, 22, 24, 26, 28, 30 and 32. The switches 18 through 32 (even numbers only) are connected to a voltage dividing network defined by a plurality of impedances such as resistances 34 through 48 (even numbers only). The resistances 34 through 48 (even numbers only) are connected between a first reference potential such as a voltage source 50 and a second reference potential such as a ground 52.

The decoder 16 operates to convert into an analog value the binary bits coded by the logic levels of the binary signals on the lines 14. One of the switches 18 through 32 (even numbers only) is then closed by the decoder 16 in accordance with this analog value. For example, the switch 18 is closed for an analog value of "0"; the switch 24 is closed for an analog value of "3"; and the switch 30 is closed for an analog value of "6". Assuming that the voltage from the source 50 provides a first reference potential such as 1.6 volts, ground voltage is introduced through the switch 18 to an output line 56 upon the closure of the switch 18; a voltage of 0.6 volts is introduced to the line 56 upon a closure of the switch 24; and a voltage of 1.2 volts is introduced to the line 56 upon a closure of the switch 30.

The output line 56 from the converter 10 is connected to one contact of a double-pole switch 62. A pole 62B of the switch 62 is connected to an interpolation line 58 in the converter 12 and that pole may be connected to either the output line 56 or to a second contact which is connected to the second reference potential such as the ground 52. The converter 12 also includes an activation line 60 which is connected to the other pole 62A of the double-pole switch 62. One contact of the pole 62A is connected to the second reference potential such as the ground 52 and the other contact of the pole 62A is connected to the source of the first reference potential. An energy storage discharge line 64 of the converter 12 preferably receives the second reference potential such as the ground 52.

The converter 12 includes a matrix, generally indicated at 65, which is formed from a plurality of switches. The matrix 65 is shown in detail in FIG. 2. Output terminals from the matrix 65 are connected to energy storage members such as capacitors 66 through 80 (even numbers only). Only some of these capacitors are shown in FIG. 1 but all are shown in FIG. 2. The charges in selected ones of the capacitors 66 through 80 (even numbers only) are introduced to a line 82 in FIG. 1.

The matrix 65 is constructed to connect successive ones of the capacitances 66 through 80 (even numbers only) to the activating line 60 for progressively increasing values coded by the logic levels of the binary signals introduced to the matrix 65 through lines 84 in FIG. 1. The capacitances connected to the line 60 become charged by the voltage produced on such line when the line is connected by the pole 62A to the source 50 of the first reference potential. As a result, the output current passing from the voltage source 50 through the matrix 65 and the capacitances to the line 82 has a magnitude corresponding to the value of the most significant bits coded by the logic levels of the binary signals in the lines 84.

For every value represented by the binary signals in the lines 84, a particular one of the capacitances 66 through 80 is connected to the interpolation line 58. This particular capacitance is the one next to be connected to the line 60 for increasing values coded by the logic levels of the binary signals in the lines 84. This particular capacitance then becomes charged when the pole 62B connects the capacitance to the voltage on the line 56 and this charge is introduced to the output line 82. As a result, the output line 82 provides at each instant a voltage which has a magnitude corresponding to the analog value coded by the logic levels of the binary signals in the lines 14 and 84.

The switch 62 is periodically operative to position the two poles of the switch against the botton contacts of the switch in FIG. 1 and then against the top contacts of the switch in FIG. 1. When the two poles of the switch 62 engage the bottom contacts of the switch, all of the capacitances 66 through 80 (even numbers only) discharge through the switch to the second reference potential such as the ground 52. An amplifier 200 is then reset by activating the reset signal on a reset line 210 and the output line 206 of the digital-to-analog converter is forced to a voltage near the second reference potential 52. The reset signal is then de-activated and the poles of switch 62 then engage the top contacts of the switch in FIG. 1. The particular capacitances 66 through 80 selected by the binary signals on lines 84 (even numbers only) are connected to the activating line 60 and become charged by the voltage from the first reference source 50 and the particular interpolation capacitance becomes charged in accordance with the voltage on the line 56. The line 82 then produces a voltage having a magnitude corresponding to the analog value coded by the logic levels of the binary signals on the lines 14 and 84.

A preferred embodiment of the matrix 65 is shown in FIG. 2. The matrix 65 includes the interpolation line 58, the activation line 60 and the discharge line 64. The matrix 65 also includes a plurality of double pole switches 100 through 126 (even numbers only). The switches 100 and 102 may be considered to constitute a first sub-set; the switches 104, 106, 108 and 110 may be considered to constitute a second sub-set; and the switches 112 through 126 may be considered to constitute a third sub-set. Each sub-set of switches receives, from an individual one of the lines 84, logic levels of binary signals having an individual binary significance. The switches 100 and 102 receive logic levels of binary signals having a lower binary significance than the binary signals received by the switches in the other sub-sets and the switches 104, 106, 108 and 110 receive logic levels of binary signals having a lower binary significance than the logic levels of the binary signals received by the switches 112 through 126 (even numbers only). As will be seen, the number of switches in each of the sub-sets is directly proportional to the binary significance of the binary signals introduced to that sub-set.

The switches shown in FIG. 2 are mechanical. However, as will be appreciated, the switches may be solid state. For example, embodiments of converters employing solid state switches are disclosed and claimed in applications Ser. Nos. 383,544 and 553,041. When solid state switches are employed, each of the switches 100 through 126 (even numbers only) may be replaced by a pair of switches. Actually, each of the switches 100 through 126 (even numbers only) may be considered as a pair with the movable contact and one pole defining one switch in the pair and the movable contact and the other pole defining the other switch in the pair.

One contact of the switch 100 is common with the line 58 and the other contact in the switch 100 is common with the line 60. Similarly, one contact in the switch 102 is common with the line 62 and the other contact in the switch is common with the line 58. Connections are made from the movable poles of the switch 100 to first contacts of the switches 104 and 106. Similarly, connections are made from the movable poles of the switch 102 to first contacts of the switches 108 and 110.

The second contact of the switch 104 is connected to the line 64 and the second contact of the switch 106 is connected to the line 60. Connections are correspondingly made from the second contact of the switch 108 to the line 64 and from the second contact of the switch 110 to the line 60. The movable poles of the switches 104, 106, 108 and 110 are respectively connected to first contacts of the switches 112 and 114, first contacts of the switches 116 and 118, first contacts of the switches 120 and 122 and first contacts of the switches 124 and 126.

The second contacts of the switches 112, 116, 120 and 124 are connected to the line 64 and the second contacts of the switches 114, 118, 122 and 126 are connected to the line 60. The movable poles of the switches 112 through 126 (even numbers only) are respectively connected to first terminals of the capacitors 66 through 80 (even numbers only). As will be seen in FIG. 2 and as will be also seen in FIG. 4, the capacitors 66 through 80 (even numbers only) are respectively designated by the numerals H through A.

The movable poles of the switches 100 through 126 (even numbers only) are shown in FIG. 2 in the positions in which they are operative when the binary signals introduced to the switches have a logic level of "0". When the logic levels of the binary signals introduced through the lines 84 to the switches 112 through 126 (even numbers only) are coded to represent a binary "1", the movable poles of the switches move from engagement with the lower contacts in FIG. 2 to engagement with the upper contacts in that Figure.

With the movable contacts of the switches 100 through 126 (even numbers only) in the positions shown in FIG. 2, no connections are established between any of the capacitors 66 through 80 (even numbers only) and the activating line 60. As a result, none of the capacitors 66 through 80 (even numbers only) is charged by the voltage on the line 60. This corresponds to a binary value of "0" in accordance with the logic levels of the binary signals introduced to the lines 84. However, a connection is established which includes the interpolation line 58, the switch 102, the switch 110, the switch 126 and the capacitance 80. Then, when the poles of the switch 62 in FIG. 1 are moved to the upper contacts, this causes the capacitance 80 to become charged to a level dependent upon the voltage on the interpolating line 58, this voltage being received from the second matrix output line 56 through the pole 62B. As a result, a signal is introduced to the line 82 in FIG. 1 in accordance with the analog value coded by the logic levels of the binary signals introduced through the lines 14 (FIG. 1) to the converter 10.

When the analog value coded by the logic levels of the binary signals introduced to the lines 84 in FIG. 1 has a value of "1" or binary "001" (the least significant binary bit being at the right), this causes the movable arms of the switches 100 and 102 to be moved in FIG. 2 to a position engaging the upper contacts of the switches. A connection is accordingly established which includes the activating line 60, the switch 102, the switch 110, the switch 126 and the capacitance 80. When the poles of switch 62 in FIG. 1 are moved to the upper contacts, this causes the capacitance 80 to be charged to a value equal to the first reference voltage on the line 50 in FIG. 1. At the same time, a connection is established which includes the interpolating line 58, the switch 100, the switch 106, the switch 118 and the capacitance 72. The capacitance 72 accordingly becomes charged to a value dependent upon the voltage on the interpolating line 58. Since the charges in the capacitances 80 and 72 are introduced to the line 82 in FIG. 1, the total charge delivered to the line 82, and hence the voltage on the integrating amplifier output line 206 in FIG. 1, represents the analog value coded by the logic levels of the binary signals in the lines 14 and 84 in FIG. 1.

Similarly, for an analog value of "2", or binary "010" coded by a logic level of binary "1" on the line S1 in FIG. 1, the capacitances 80 and 72 become charged through a circuit including the first reference voltage source 50 and the activation line 60 when the switch 62A is operated to energize the activation line 60. At the same time, the capacitor 76 becomes connected to the line 58 so as to become charged to a level dependent upon the voltage received through the pole 62B from the output line 56.

FIG. 4 indicates the capacitances which are respectively connected to the lines 60 and 58 for each analog value coded by the logic levels of the binary signals on the lines 84. As will be seen in FIG. 4, the logic levels of the binary signals introduced to the lines 84 are indicated in the first three columns in FIG. 4. The analog significance of these binary signals is shown at the top of each of these columns. The remaining columns (with the exception of the last column) indicate the state of operation of the capacitances 66 through 80 (even numbers only), these capacitances being respectively indicated in FIG. 4 by the letters "H" through "A" to correspond to the letters indicated for these capacitances in FIG. 2. The last column in FIG. 4 indicates the particular one of the capacitances to be connected to the interpolation line 58 for each analog value coded by the logic levels of the binary signals on the lines 84.

As will be seen in FIG. 4, two diagonal lines 130 and 132 are provided. The capacitances indicated to the left of the line 130 represent those connected to the activation line 60 for the different analog values. The capacitances isolated between the lines 130 and 132 are those which are connected to the interpolation line 58 for each analog value. These capacitances correspond to those indicated in the last column in FIG. 4. As will be seen, the capacitance connected to the interpolation line 58 for each analog value is the one next to be connected to the activation line 60 when the analog value represented by the logic levels of the binary signals coded on the lines 84 increases.

The signal on the line 82 in FIG. 1 is applied to a stage, generally indicated at 200, for producing an output voltage representative at the end of each conversion cycle of the energy delivered to the line 82 by the energy storage means. The stage 200 is shown as a single block in FIG. 1 and is shown in additional detail in FIG. 3. The stage 200 may include an integratoring amplifier and a circuit for resetting the voltage produced at the output of the integrating amplifier in response to a reset signal on a line 210. The integrating amplifier may include a high-gain operational amplifier 202 in FIG. 3. One input terminal of the amplifier 202 receives the voltage on the line 82 and another input terminal of the amplifier has a common connection with the second reference potential such as the ground 52. A capacitance 204 in FIG. 1 is connected between the input terminal 82 and an output terminal 206 of the amplifier 202. A resistance 207 and a reset switch 208 are in series across the capacitance 204. The reset switch closes in response to a reset signal on the line 210.

The signal charge on the line 82 is introduced to the operational amplifier 202, which operates in conjunction with the capacitance 204 to integrate this signal charge. As a result, during the opened state of the switch 208, the capacitance 204 receives the signal charge. This signal charge corresponds to the analog value coded by the logic levels of the binary signals on the lines 14 and 84 in FIG. 1. When the switch 208 becomes closed, the charge in the capacitance 204 is discharged through the switch 208 and the resistance 207 and the voltage at the output line 206 is reset to a value that differs from the second reference potential such as ground only by the small input offset voltage and any noise in the operational amplifier 202.

The operation of the switch 208 is synchronized with the operation of the switch 62 so that the switch 208 is open during the period of connection of the movable pole of the switch 62 to the upper contacts in FIG. 1 and is closed during the period of connection of the movable pole of the switch 62 to the lower contacts of the switch 62 in FIG. 1. In this way, the capacitance 204 becomes charged during the same period as the charging of the selected ones of the capacitances 66 through 80 (even numbers only) and the capacitance 204 becomes discharged at the same time that the capacitances 66 through 80 (even numbers only) become discharged. As a result, a square wave pulse is produced on the line 206 with a magnitude indicating the analog value coded by the logic levels of the binary signals on the lines 14 and 84.

The apparatus disclosed above has certain important advantages. One of these results from the fact that the capacitance connected to the interpolation line 58 at each instant is the same one to be connected next to the activating line 60 for increasing values coded by the logic levels of the binary signals in the lines 14 and 84. Because of this, the charge delivered to the line 82 corresponding to an increase in the input digital code by a least significant bit from the full output of the second matrix relationship 65 is determined by one and the same capacitor plus the same stray capacitance of that capacitor. This minimizes any error which is produced in the charge signal on the line 82 in FIG. 1. These advantages enhance the monotonicity of the converter constituting this invention and help to minimize any integral and differential linearity errors in the converter.

Another important advantage in applicant's invention is that each of the capacitances 66 through 80 (even numbers only) in the converter 12 has substantially the same layout on an integrated circuit chip and consequently the same value. This is particularly significant in view of the fact that the capacitance connected to the interpolation line 58 for each analog value also has the same value. Furthermore, the capacitances 66 through 80 (even numbers only) are individually connected to the activation line 82 for progressively increasing values. As the values progressively increase, the capacitances previously connected to the line 82 remain connected to the line and additional capacitances are connected to the line. All of the features discussed in this paragraph insure that the signal on the line 82 is monotonic and that minimal transients are produced when the magnitude of the signal on the line 82 changes.

In view of the advantages discussed in the previous paragraphs, a conventional amplifier such as the integrating amplifier 200 can be used to convert to an analog voltage the charge signals from the matrix relationship 10 and the matrix relationship 12. Furthermore, the deviations allowable in the accuracy of the components of the matrix relationship 10 such as the resistance ladder formed by the resistances 34 through 48 (even numbers only) can be less stringent than in corresponding apparatus of the prior art. For example, when the apparatus constituting this invention operates upon sixteen (16) binary bits, the converter 12 may operate upon a number of bits such as the ten (10) most significant binary bits and the converter 10 may operate upon the remaining number of bits such as the six (6) least significant binary bits. Under such circumstances, the resistances 34 through 48 (even numbers only) may have deviations in value as high as two percent (2%) while still maintaining monotonicity of the apparatus of this invention. When deviations in value as high as two percent (2%) are allowable in components such as resistors, the resistors can be manufactured using low cost monolithic techniques while still retaining monotonicity and low integral and differential errors in the apparatus constituting this invention. It is also relatively easy to provide resistors within such limits of deviations because the resistances 24 through 38 (even numbers only) may be considered to constitute a single resistor with a number of taps.

The apparatus constituting this invention also has other important advantages. For example, because the converter 12 may have to convert only the ten (10) most significant bits out of a total of sixteen (16) bits to be converted, the apparatus constituting this invention can be disposed on a single integrated circuit chip. The conversion of a minimal number of bits in the converter 12 is desirable because the number of switches in the converter approximately doubles for each additional binary bit which is to be decoded by the converter.

The ability to provide sixteen (16) bits on a single integrated chip is particularly important when the apparatus constituting this invention is used to convert logic levels of binary signals into audible sound. One reason is that the digital audio reproducers now in use reproduce into audible sound the logic levels of binary signals coding sixteen (16) binary bits recorded on a compact disc to code for analog information. This recording ability is particularly important when, as in applicant's invention, the converting apparatus is able to convert the signals coding the sixteen (16) binary bits into analog information on a monotonic basis and with minimal and differential errors.

As will be appreciated, the output on the line 82 is a charge. It is desirable to provide an output in the form of a charge rather than in the form of a current because it is easier to provide a precision charge output, particularly on an integrated circuit chip with components formed in C-Mos technology, rather than a precision current output.

There are also other important advantages to applicant's invention. This results from the use by applicant of an integrating-amplifier, such as that formed by the amplifier 202 and the capacitor 204, to convert the signal on the line 82 to an output voltage on the line 206 in FIG. 3. An integrating-amplifier is relatively accurate and relatively easy to build in comparison to other types of output stages.

The apparatus of this invention can be used in a wide variety of fields. As previously discussed, the apparatus of this invention is particularly adapted to be used to convert into audible sound of considerable fidelity the logic levels of binary signals recorded on a compact disc and coded in binary form to represent such analog information. However, even when capacitances such as the capacitances 66 through 80 (even numbers only) are used to produce the analog conversion, the apparatus constituting this invention has the capability of being operated at much higher rates than would be normally expected. This results in part from the advantages inherent in applicant's invention and described in some detail above. As a result, applicant's invention can advantageously be used in a number of other fields including telecommunications, process controls and robotics.

Although this invention has been disclosed and illustrated with reference to particular embodiments, the principles involved are susceptible of use in numerous other embodiments which will be apparent to persons skilled in the art. The invention is, therefore, to be limited only as indicated by the scope of the appended claims.

I claim:

1. In combination for converting a digital value in binary coded form to a corresponding analog value,
    means for providing a plurality of binary signals each having a first and second logic levels respectively coding for values of binary "1" and binary "0", each of the binary signals having the same characteristics as the other binary signals in the plurality, each of the binary signals in the plurality having an individual binary significance, the combination of the binary signals coding for the digital value,
    sub-sets of control switches each having first and second states of operation, the switches in each sub-set being responsive to an individual one of the binary signals of relatively high binary significance in the plurality to become operative in particular ones of the first and second states in accordance with the logic levels of the associated binary signals, the number of switches in each sub-set being related to the binary signficance of the associated binary signal, a plurality of storage means each coupled to an individual one of the switches int eh sub-set of highest binary significance, each of the storage means in the plurality being constructed to store enegy, each ofthe storage means in the plurality having the same value, an output line, means for connecting the control switches in the sub-sets in a matrix relationship to the storage means in the plurality to obtain a connection of progressive ones of the storage means in the plurality of the ouput line in accordance with progressive increases in the digital value coded by the binary signals, the storage means in the plurality being coupled to the first matrix relationship to store energy in an amount related to the value coded by the logic levels of the binary signals of relatively high binary signficance, means defining a second matrix relationship, means for introducing binary signals of relatively low binary signifiance to the second matrix relationship to obtain from the second matrix relationship a voltage related to the value coded by the logic levels of the binary signals of relatively low binary signficance, means in the first matrix relationship for receiving the voltage fromt he second matrix relationship and for storing in a particular one of the storage means in the plurality energy in an amount related to such voltage the particular storage means in the plurality being the one next to be connected to the output line for increases in the digital value coded by the binary signals, and means for producing a signal having chracteristics representative of the eneryg stored int eh storage means in the plurality.

2. A combination as set forth in claim 1 wherein the storage means constitutes capacitors.

3. A combination as set forth in claim 1 wherein the switches in each subset have the same connections to the switches in the sub-sets of next highest and lowest binary significance as the switches in other sub-sets have to the switches of next highest and lowest binary significance relative to such other sub-sets.

4. A combination as set forth in claim 3 wherein the storage means constitute capacitors and the signal producing means constitutes an integrating amplifier and the integrating amplifier includes a capacitor for receiving a charge representative of the analog value and means are associated with the capacitor in the integrator amplifier for discharging the capacitor after the storage in the capacitor of the charge representative of the digital value.

5. In combination for converting a digital value in binary coded form to a corresponding analog value, means for providing a plurality of binary signals each having first and second logic levels respectively coding for values of binary "1" and binary "0", each of the binary signals in the plurality having the same lgoic levels as the other binary signals, each of the binary signals in the plurality having an individual binary signficance, the binary signals in the plurality cumulatively representing the digital value, means for providing a voltage related to the value represented by the binary signals of reduced binary significance in the plurality, a plurality of storage means each having particular capacity for storing energy and each having the same capacity as the other storage means in the plurality;

an output line, means for providing a charging voltage, means defining a matrix relationship for providing for the connection to the output line of a number of storage means in the plurality related to the digital value coded by the logic levels of the binary signals of increased binary significance, the matrix relationship being constructed to retain the connection of the same storage means in the plurality of the output line for the storage of energy for increases in the digital value and to provide for the connection of additional sotrage means in the plurality to the output line in accordance with such increases in the digital values, the matrix relationship being connected to the voltage means to provide for the charging by the charging voltage of the storage means connected in the plurality to the output line, means for providing for the introduction to a particular one of the storage means in the plurality the voltage related to the value represented by the binary signals of reduced binary significance in the plurality, the particular one of the storage means in the plurality being the next to be connected to the output line for increases in the digital value coded by the logic levels of the binary signals of relatively high binary significance, and means operatively coupled to the storage means in the plurality of producing an output signal having characteristics related to the energy stored in the storage means in the plurality.

6. A combination as set forth in claim 5, means for applying a reference voltage to the storage means not connected in the plurality to the output line.

7. A combination as set forth in claim 6, including, means for providing for a periodic discharge of the energy stored in the storage means connected to the output line.

8. A combination aś set forth in claim 7 wherein the means for producing the voltage related to the value coded by the logic levels of the binary signals of reduced binary significance defines a second matrix relationship.

9. In combination for converting a digital value in binary coded form to a corresponding analog value, a plurality of storage means each constructed to store the same amount of energy as the other storage means in the plurality, means for providing a plurality of binary signals each having first and second logic levels respectively coding for values of binary "1" and binary "0", each of the binary signals in the plurality having the same logic levels as the other binary signals in the plurality, each of the binary signal in the plurality having an individual binary significance, the binary signals in the plurality cumulatively representing the analog value, means responsive to the binary signals of relatively low binary significance for producing a first voltage having a magnitude related to the binary value coded by such binary signals, a first line, a plurality of switches connected in a matrix relationship to the storage means in the plurality and to the first line for coupling first particular ones of the storage means in the plurality to the first line in accordance with the value coded by the binary signals of relatively high digital sigigifance and for retaining the coupling of such first particular one of the storage means to the first line for progressive increases in the digital value coded by the binary signals, means for introducing the first voltage to a second particular one of the storage means in the plurality, the second particular one of the storage means in the plurality being next included in the first particular ones of the storage means in the plurality for increases in the digital value coded by the logic levels of the binary signals in the plurality, means for introduicng energy to the first line to obtain the storage of such energy by the first particular ones of the storage means in the plurality, and means responsive to the energy stored in the first particular ones of the storage means in the plurality and in the second particular one of the storage means in the plurality for providing an output indication of such stored energy.

10. A combination as set forth in claim 9, including, the first voltage means including a second matrix relationship responsive to the binary signals of reduced binary significance and the output signal means producing a voltage having a magnitude indicative of the energy stored in the first particular ones of the storage means in the plurality and in the second particular one of the storage means in the plurality.

11. A combination as set forth in claim 9 wherein the switches in the matrix relationship are connected in sub-sets each having an individual binary significance and wherein the switches in each sub-set have the same connections to the switches in the sub-sets of next highest and lowest binary significance as the connections between the switches in other sub-sets and the switches in the sub-sets of next highest and lowest binary significance relative to such other sub-sets.

12. A combination as set forth in claim 10 wherein the storage means isn the plurality constitute capacitors and wherein the output signal means includes an integrating amplifier and the integrating amplifier includes a capacitor and wherein the capacitor in the integrating amplifier is charged in accordance with the energy in the first particular ones of the storage means in the plurality and the second particular one of the storage means in the plurality.

13. A combination as set forth in claim 9, including, means for providing for the storage of energy in the first particular ones of the storage means in the plurality after the connection of such storage means to the first line and means for providing for the output indication after the storage of energy in the first particular ones of the storage means in the plurality.

14. In combination for converting a digital value in binary coded form into an analog indication, means for providing a plurality of binary signals each having first and second logic levels respectively coding for a binary "1" and a binary "0" and each having an individual binary significance and each having the same logic levels as the other binary signals in the plurality, the binary signals in the plurality cumulatively representing the digital value, an interpolation line, an activating line, means responsive to the binary signals in the plurality of reduced binary significance for introducing to the interpolation line a signal coding for the value represented by such binary signals, a plurality of switching means each having first and second states of operation, the switching means in the plurality defining a matrix relationship, the switching means in the plurality being responsive to the binary signals in the plurality of increased binary significance to become operative in the first and second states in accordance with the characteristics of such binary signals, a plurality of storage means each constructed to store energy, each of the storage in the plurality having substantially the same value as the other storage means in the plurality, means connecting the interpolation line, the activating line, the switches in the plurality and the storage means in the plurality in a matrix relationship to provide for a connection to the activating line of a number of the storage means in the plurality related to the value coded by the logic levels of the binary signals of increased binary significance and to provide for the retention of the connections previously made to the activating line of such storage means for increases in the digital value and to provide for the connection to the interpolation line of a particular one of the storage means in the plurality other than the storage means connected to the activating line, the particular one of the storage means in the plurality being the one next to be connected in the plurality to the activating line for increases in the digital value coded by the logic levels of the binary signals in the plurality, means for providing for the activation of the storage means connected in the plurality to the activating line to obtain a storage of energy in such storage means, and means for providing an output indication of the energy stored in the storage means connected to the activating line and the interpolation line.

15. A combination as set forth in claim 14 wherein the switches in the plurality are connected in the matrix relationship to provide for the flow of the same magnitude of current through each of such switches regardless of the digtal value to be converted to the analog value.

16. A combination as set forth in claim 14 wherein the switches in the plurality are disposed in sub-sets each responsive to one of the binary signals in the plurality of individual binary significance and wherein the switches in each sub-set have the same connections to the sub-sets of next highest and lowest binary significance as the connections between the switches in other sub-sets and the switches in the sub-sets of next highest and lowest binary significance relative to such other sub-sets.

17. In combination for converting a digital value in binary coded form into an analog value, means for providing a plurality of binary signals each having first and second logic level respectively coding for a binary "1" and a binary "0" and each having an individual binary significance and each having the same logic levels as the other binary signals in the plurality, the binary signals in the plurality cumulatively representing the digital value, a plurality of storage means each constructed to store the same amount of energy as the other storage means in the plurality, an activating line, means connected in a matrix relationship to the activating line and responsive to the binary signals of increased binary significance in the plurality for producing in the activating line a flow of current having a magnitude related to the binary value of the binary signals of increased binary significance, the matrix means being constructed to connect successive ones of the output members in the plurality to the activating line through the matrix relationship for progressive increases in the digital value and to retain the connection to the activating line through such a matrix relationship for such progressive increases in the digital value of the output members previously connected in the plurality to the activating line, and means responsive to the energy stored in the storage means connected in the plurality to the activating line through the matrix relationship for providing a voltage indicative of such energy.

18. A combination as set forth in claim 17, including, a reference line, the matrix means being constructed to connect to the reference line the output members not connected in the plurality to the activating line through the matrix relationship.

19. A combination as set forth in claim 18, including, means responsive to the binary signals of reduced binary significance in the plurality of producing a voltage related to the value coded by the logic levels of such binary signals to produce a flow of current through an additional one of the storage means in the plurality in accordance with the magnitude of such voltage.

20. A combination as set forth in claim 19, the storage means in the plurality receiving energy from the voltage means being the next to the coupled in the matrix relationship to the activating line for progressive increases in the digital value.

21. In combination for converting a digital value in binary coded form into an analog value, means for providing a plurality of binary signals each having first and second logic levels respectively coding for a binary "1" and a binary "0" and each having an individual binary significances and each having the same logic levels as the other binary signals in the plurality, the binary signals in the plurality cumulatively representing the digital value, a plurality of switches each having first and second states of operations and each responsive to the logic levels of an individual one of the binary signals in the plurality to become operative in the first and second states in accordance with such logic levels, means for producing a signal having characteristics representative of the binary signals in the plurality of relatively low binary significance, a plurality of storage means each constructed to receive and store energy, each of the storage means in the plurality having substantially the same value as the other storage means in the plurality means for connecting the switches in the plurality in a matrix relationship and responsive to the logic levels of the binary signals in the plurality of relatively high binary significance for obtaining the introduction of energy to particular ones of the storage means in the plurality in accordance with the value coded by the logic levels of such binary signals and responsive to the signal having characteristics representing the value of the binary signals of relatively low binary significance for obtaining the introduction of energy to an additional one of the storage means in the plurality in accordance with the characteristics of such signal, and means responsive to the energy in the particular ones and the additional one of the storage means in the plurality producing an output signal in accordance with the magnitude of such energy.

22. A combination as set forth in claim 21, wherein the matrix relationship defined by the switches in the plurality is constructed to isolate the additional one of the storage means in the plurality for each digital value coded by the logic levels of the binary signals in the plurality and wherein the additional switch in the plurality is the next to be incldued in the particular ones of the switches in the plurality when the digital value coded by the logic levels of the binary signals in the plurality is increasing.

23. A combination as set forth in claim 22 wherein an interpolation line is included and is connected by the matrix relationship to the additional storage means in the plurality and the signal coded by the logic levels of the binary signals of relatively low binary significance is introduced to the interpolation line.

24. A combination as set forth in claim 21 wherein the matrix relationship is constructed to provide for the introduction of energy to the particular storage means in the plurality for increases in the digital value and to provide for the introduction of energy to other storage means in the plurality for increases in the digital value to provide for the inclusion of such other storage means in the particular storage means.

25. In combination for converting a digital value in binary coded form into an analog value, means for providing a plurality of binary signals each having first and second logic levels respectively coding for a binary "1" and a binary "0", the binary signals in the plurality cumulatively coding for the digital value in binary form, each of the binary signals having a different binary significance, each of the binary signals in the plurality having the same logic levels as the other binary signals in the plurality, a plurality of switches connected in a matrix relationship, each of the switches in the plurality having first and second states of operation, the switch in the plurality being disposed in sub-sets each responsive to an individual one of the binary signals in the plurality to provide for an operation of the switches in the first and second states in accordance with the logic levels of such individual one of the binary signals, means for introducing an activating voltage to particular ones of the switches in the matrix relationship in accordance with the operation of the switches in the plurality in the first and second states, a plurality of storage means each constructed to receive and store energy, each of the storage means in the plurality having the same value as the other storage means in the plurality, the storage means in the plurality being connected to the switches of relatively high binary signficance in the matrix relationship to receive energy from the activating means through the switches in the matrix relationship in accordance with the operation of the switches in the plurality in the first and second states, progressive one of the output members in the plurality being connected to the activating means for progressive increaes in the digital value and remaining thereafter connected to the activating line for such progressive increases in the digital value, and means for producing an output signal representative of the energy stored in the storage means in the plurality from the activating means, the same switches in the plurality being responsive to the logic levels of the binary signals in the plurality and being connected in the matrix relationship.

26. A combination as set forth in claim 25 wherein an interpolation line, means connected in the matrix relationship to the interpolation line for connecting to the interpolation line the storage means next to be connected in the plurality to the activating means, and means for introducing to the interpolating line a voltage representative of the binary signals of relatively low binary significance.

27. A combination as set forth in claim 26 wherein the output signal means includes an integrating amplifier having a capacitor connected across the amplifier for receiving a charge corresponding to the energy in the storage means in the plurality and wherein the storage means in the plurality constitute capacitors.

28. A combination as set forth in claim 25, wherein the number of switches responsive in the plurality to each of the binary signals in the plurality is directly related to the binary significance of such binary signal and wherein the activating voltage is introduced to the storage means in the plurality when an output indication is to be produced and wherein means are included for discharging the energy in the storage means after the output signal has been produced.

29. In combination for converting a digital value in binary coded form to an analog value, means for providing a plurality of binary signals each having first and second logic levels respectively coding for a binary "1" and a binary "0", the plurality of signals cumulatively representing the digital value in binary coded form, each of the binary signals in the plurality having an individual binary significance, each of the binary signals in the plurality having the same logic levels as the other binary signals in the plurality, first and second sub-sets of control siwtches, the number of switches in each sub-set directly related to the binary significance of the binary introduced to such sub-set, the switches in the first and second sub-sets having first and second states of operation and being responsive to the logic levels of the associated binary signals to become operative in the first and second states in accordance with the logic levels of such binary signals, the first sub-set having a lower binary significance than the second sub-set, the switches in the first and second sub-sets being connected in a matrix relationship, means for introducing an activating voltage to the switches in the first sub-set, a plurality of storage means each constructed to store energy, the storage means in the plurality being connected to the switches in the second sub-set, each of the storage means in the plurality having the same value as the other storage means in the plurality, the matrix relationship providing for the introduction of the activating voltage to progressive ones of the storage means in the plurality for progressive increases in the digital value and providing for the continued introduction of the activating voltage to such storage means for such progressive increases in the digital value, and means for producing an output signal representative of the energy stored in the storage means from the activating means, the same switches in the plurality being responsive to the binary signals and being connected in the matrix relationship.

30. A combination as set forth in claim 29 including, an interpolation line, means for introducing to the interpolating line a voltage having a binary significance lower than the binary significance of the signals introduced to the switches in the first and second sub-sets, the matrix relationship being connected to the switches in the first and second sub-sets to introduce the voltage on the interpolating line to the storage means next receiving the activating voltage for progressive increases in the digital value.

31. A combination as set forth in claim 29 wherein the output signal means includes an integrating amplifier and the storage means constitutes capacitors and the integrator amplifier includes a capacitor connected across the integrator amplifier to store a charge corresponding to the charge in the capacitors in the plurality.

32. In combination for converting a digital value in binary coded form into a corresponding analog value, first means for providing a plurality of binary signals each having first and second logic levels respectively coding for a binary "1" and a binary "0", the plurality of signals cumulatively coding for the digital value in binary coded form, each of the binary signals in the plurality having an individual binary significance, each of the binary signals in the plurality having the same logic levels as the other binary signals in the plurality, second means responsive to the logic levels of the binary signals of relatively low binary significance for storing an amount of energy related to the value coded by the logic levels of such binary signals, means including a plurality of switches having first and second states of operation and defining a matrix relationship and responsive to the logic levels of the binary signals of relatively high binary significance for obtaining the operation of the switches in the first and second states in accordance with the logic levels of such binary signals, each of the switches in the plurality being responsive only to the logic levels of an individual one of the binary signals of corresponding binary significance, activating means for providing energy, the activating means being connected to the matrix relationship to introduce energy to the matrix relationship, a plurality of storge means each constructed to store the same amount of energy as the other storage means in the plurality, the storage means in the plurality being connected to the switches in the plurality to provide for a storage of energy in individual ones of the storage means in the plurality through the matrix relationship from the activating means in accordance with the binary values coded by the binary signals of the relatively high binary significances and to retain the storage of energy in first particular ones of such individual storage means in the plurality for progressive increases in the digital value and to provide for the addition of second particular ones of the individual storage means in the plurality for such progressive increases in the digital value the matrix relationship being constructed to provide for the introduction of the voltage on the interpolating line to the next one of the voltage means to be included in the plurality as one of the second storage means for progressive increases in the digital value, and means responsive to the energy stored in the second means and in the first and second particular ones of the storage means in the plurality for producing an output signal having characteristics of such energy.

33. A combination as set forth in claim 32, including, the switches responsive to the signals of each individual binary significance having the same connections to the switches of next higher and lowest binary significance as the connections between the switches of other binary significances and the switches of next highest and lowest binary significance relative to such other binary significances.

34. A combination as set forth in claim 33 wherein each of the switches in the plurality receives the same amount of energy as the other switches in the plurality regardless of the digital value.

35. A combination as set forth in claim 32 wherein the output signal means includes an integrating amplifier for storing an amount of energy related to the cumulative amount of the energy stored in the second means and the energy stored in the first and second paritcular ones of the storage means in the plurality by the activating means.

36. In combination for converting digital value in binary coded form into an analog value, means for providing a plurality of binary signals each having first and second logic levels respectively coding for a binary "1" and a binary "0" and each having an individual binary signifiance and each having the same logic levels as the other binary signals, the binary signal in the plurality cumulatively coding for the digital value, means responsive to the logic levels of the binary signals in the plurality of relatively low binary significance for producing a first signal having characteristics representative of the binary values coded by the logic levels of such binary signals, means including a plurality of energy storage means and a plurality of switching elements connected in a matrix relationship and responsive to the logic levels of the binary signals in the plurality of relatively high binary significance for activating progressive ones of the output members in the plurality for progressive increase in the digital value, and for maintaining such progressive members activated for such progressive increases in the digital value to produce a second signal having characteristics representative of the binary values coded by the logic levels of such signals, the first signal means being connected in the matrix relationship to the next one of the energy storage means in the plurality to be activated for progressive increases in the digital value to obtain the production of a third signal in such next one of the storage means, and means for combining the second and third signals to produce an output signal with characteristics coding for the analog value.

37. A combination as set forth in claim 36, including, each of the switching elements in the plurality having an individual binary significance and being responsive only to the binary signals in the plurality of corresponding binary significance.

38. A combination as set forth in claim 37 wherein the first signal means has substantially the same construction as the means producing the second signal.

39. A combination as set forth in claim 38 wherein the first signal means includes means defining a second matrix relationship and responsive to the logic levels of the signals of relatively low binary significance for producing the first signal.

40. A combination as set forth in claim 39 wherein each of the energy means in the plurality constitutes a capacitance and the output signal means includes an integrator amplifier.

41. A combination as set forth in claim 29 wherein the output signal means includes an integrator amplifier.

42. A combination as set forth in claim 28 wherein the output signal means includes an integrator amplifier.

* * * * *